(12) United States Patent
Kim (10) Patent No.: US 7,291,550 B2
(45) Date of Patent: Nov. 6, 2007

(54) METHOD TO FORM A CONTACT HOLE

(75) Inventor: Jeong-Ho Kim, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 464 days.

(21) Appl. No.: 10/778,293

(22) Filed: Feb. 13, 2004

(65) Prior Publication Data

US 2005/0181588 A1    Aug. 18, 2005

(51) Int. Cl.
   *H01L 21/4763*  (2006.01)
(52) U.S. Cl. .................. 438/618; 438/622; 438/624; 438/637
(58) Field of Classification Search .......... 438/618, 438/622, 624, 637
   See application file for complete search history.

(56) References Cited

U.S. PATENT DOCUMENTS

| 5,423,945 | A | 6/1995 | Marks et al. |
| 5,505,816 | A | 4/1996 | Barnes et al. |
| 6,536,449 | B1 | 3/2003 | Ranft et al. |
| 6,583,065 | B1 | 6/2003 | Williams et al. |

OTHER PUBLICATIONS

Hu et al., "Resist stripping for multilevel interconnect integration with Low K dielectric material", AVS first inter conference on Microelectronics and interfaces, Feb. 2000.

*Primary Examiner*—Long Pham
(74) *Attorney, Agent, or Firm*—William J. Stoffel (57) ABSTRACT

A example method of forming of a contact hole by removing residue and oxide spacer beside a nitride spacer after a CF containing etch. We provide a gate structure with nitride spacers on the sidewalls of the gate. We provide a dielectric layer (oxide) over the substrate and gate structure. We form a contact photoresist pattern over the oxide dielectric layer. We etch the oxide dielectric layer using fluorocarbons (CxFy) to form contact openings and residual spacer. The photoresist is striped. Preferably, a $NF_3$ and $N_2$ and $H_2$ plasma treatment is performed to deposit a byproducts layer over the residual spacer. The byproducts layer and residual spacer are removed preferably using one of the following processes: (1) heat (2) DI rinse or (3) IR or UV radiation.

26 Claims, 6 Drawing Sheets

FIGURE 10.
X-SEM MICROGRAPH SHOWS
VOID IN OXIDE GAP-FILLING

X-SEM MICROGRAPH AFTER HIGHLY SELECTIVE CONTACT OXIDE ETCHING
SHOWS OXIDE RESIDUE WITHIN CONTACT HOLE

METHOD TO FORM A CONTACT HOLE

BACKGROUND OF INVENTION

1) Field of the Invention

This invention relates generally to fabrication of semiconductor devices and particularly to a process for etching an opening in semiconductor structures and more particularly to an etch method to form a contact hole in a dielectric film.

2) Description of the Prior Art

In the manufacture of integrated circuits, silicon-containing layers on a substrate are etched to form gates, vias, contact holes, trenches, and/or interconnect lines. The etched areas are later filled with electrically conductive material to form electrically conductive interconnects or with insulating materials in the case of gate structures. Examples of such silicon-containing materials include silicon dioxide, silicon nitride, polysilicon, metal silicide, and monocrystalline silicon. The substrate may also contain layers of other materials, for example metal conductor layers, insulative layers, anti-reflective layers, or diffusion layers, among others.

In a typical etching process, a patterned mask composed of a material less susceptive to etching, such as photoresist, or a hard mask layer such as silicon dioxide or silicon nitride, is formed over the substrate. Thereafter, the substrate is placed within a process chamber and etched by a plasma of etchant gas in the chamber. The residue of material deposited on the substrate is then etched. The composition of the residue is dependent upon the etchant gas that is used, the substrate material, and composition of the mask or resist layer.

The importance of overcoming the various deficiencies is evidenced by the extensive technological development directed to the subject, as documented by the relevant patent and technical literature. The closest and apparently more relevant technical developments in the patent literature can be gleaned by considering U.S. Pat. No. 5,505,816 (Barnes et al.) shows a process to etch oxide selectively to SiN and poly.

U.S. Pat. No. 6,583,065B1 (Williams) shows a sidewall polymer removing etch process.

U.S. Pat. No. 6,536,449B1 (Ranft et al.) shows a down stream plasma process.

Hu et al., "Resist stripping for multilevel interconnect integration with Low K dielectric material", AVS first inter conference on Microelectronics and interface, February 2000.

U.S. Pat. No. 5,423,945 (Marks et al.) shows a selectivity for etching an oxide over a nitride.

There is a need for an improved etch process.

SUMMARY OF THE INVENTION

It is an object of an aspect of an embodiment of the present invention to provide a method for etching a opening.

Some non-limiting embodiments show a method for removing a residue oxide spacer from a contact opening sidewall. A contact opening is etched into a dielectric layer comprised of oxide. The etch process creates an undesired residual oxide spacer on the contact opening sidewall. A plasma treatment using nitrogen, fluorine and hydrogen containing gasses is used to form a by-products layer over the undesired residual oxide spacer. Then the by-products layer and the undesired residual oxide spacer are removed preferably using one of the following: (1) heating, (2) DI rinse and (3) UV radiation.

The above advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

I. Overview of an Aspect of the Invention

Embodiments show a method for removing a residue oxide spacer from a contact opening sidewall. A contact opening is etched into a dielectric layer comprised of oxide. The etch process creates an undesired residual oxide spacer on the contact opening sidewall. (See FIG. 3, residual spacer 70) A plasma treatment using nitrogen, fluorine and hydrogen containing gasses (e.g., $NF_3$ and $N_2+H_2$) is used to form a by-products layer over the undesired residual oxide spacer. (See FIG. 4, by-products layer 72) Then the by-products layer and the undesired residual oxide spacer are preferably removed using one of the following: (1) heating, (2) DI rinse and (3) UV radiation. See FIG. 5.

II. Method to an Opening

Embodiments of present invention will be described in detail with reference to the accompanying drawings. Some embodiments provide a method of forming a contact hole.

An aspect of the invention is a method of fabrication a contact hole. Aspects remove an oxide residue and an oxide spacer beside a nitride spacer after an oxide etch. An embodiment of the process is described as follows.

A. A Gate Structure, Line and Dielectric Layer

Figure 1:
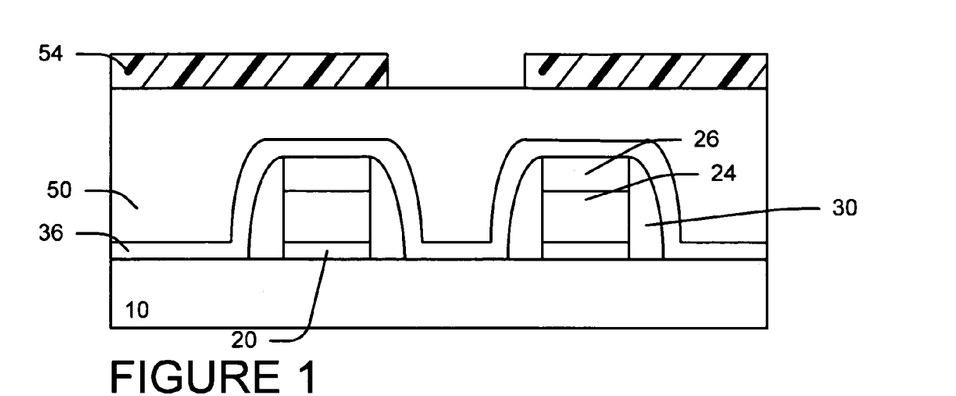
FIGS. 1 through 7 are cross sectional views for illustrating an etch method according to an aspect of the present invention.

Referring to FIG. 1, we provide a gate structure 20 24 26 over a substrate 10. The gate structure is preferably comprised of a gate dielectric 20, a gate electrode 24 and a nitride hard mask 26.

We provide spacers 30 over the sidewalls of the gate structure 20 24 26. The nitride spacers 30 are preferably comprised of nitride and preferably have a thickness of between 300 and 2000 Å.

We form a nitride liner 36 over the nitride spacers 30 and the gate structure 20 24 26 and the substrate 10.

The nitride liner 36 preferably has a thickness between 50 and 1500 Å.

We provide a dielectric layer 50 preferably comprised of oxide over the nitride liner 36.

The dielectric layer 50 is preferably formed by a HDP oxide or BPSG oxide process and has a thickness between 3000 and 10,000 Å.

B. Contact Photoresist Pattern

Still referring to FIG. 1, we form a contact photoresist pattern 54 over the oxide dielectric layer 50. The photoresist pattern has an opening over a contact area.

C. Contact Opening and a Residue Spacer

Figure 2:
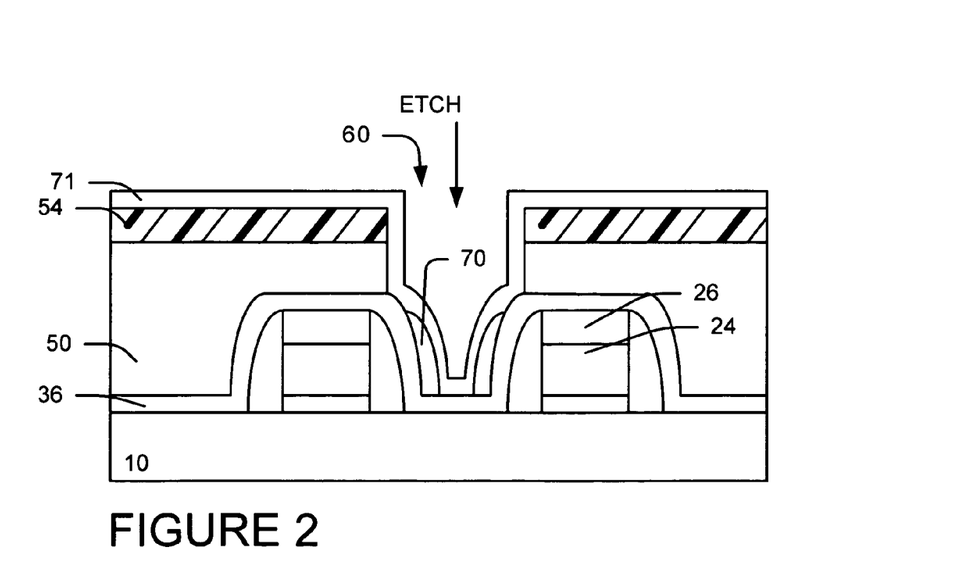

Referring to FIG. 2, we place the substrate into a etching chamber and etch the dielectric layer 50 using fluorocarbons (CxFy) to form a contact opening 60, an unintentional—undesired residual (e.g., oxide) spacer 70 and a polymer layer 71.

The contact opening 60 exposes the nitride liner on the gate structure sidewalls and on the substrate adjacent the gate structure.

The residue spacer 70 is on the sidewalls of the nitride spacer. The residual spacer is preferably mostly comprised of oxide (from the dielectric layer 50) and is preferably greater than 90% oxide and is preferably greater than 99% oxide. The residual spacer usually has a thickness of less than 150 Å.

The polymer layer 71 is preferably over the residual spacer 70, the nitride line 36, the sidewalls of the dielectric layer 50. The polymer layer 71 is thought to be comprised of a CxHyFz.

The etch process of the contact opening preferably comprises: a RF bias power between 500 and 1000 W, a process pressure between 5 and 200 mTorr, a carbon fluoride containing gas (such as $C_xF_y$, $C_4F_8$ or $C_5F_8$, $C_4F_6$, $C_2F_4$, etc.) with a flow between 3 and 50 sccm, a $O_2$ flow between 0 and 50 sccm, a $CH_2F_2$ (or $CH_3F$) flow between 0 and 50 sccm, an inert gas (such as Ar or He) flow between 0 and 1000 sccm.

This highly selectively oxide etching to nitride using a high polymerization gas like $C_4F_8$, $C_5F_8$, $C_4F_6$ is used to get high selectivity oxide to nitride. The polymer layer 71 (e.g., $C_xH_yF_z$) generated during oxide etching can give less nitride etching rate and higher oxide etching rate to lead to high selectivity oxide to nitride.

D. Striping the Contact Photoresist Pattern

Figure 3:
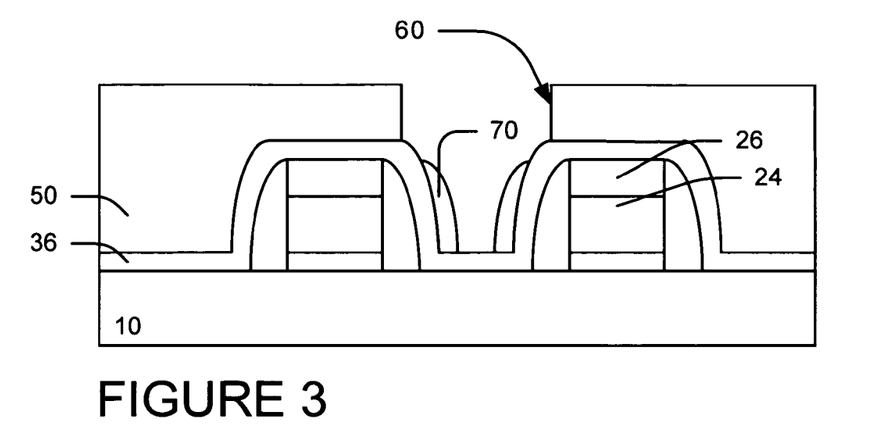

Referring to FIG. 3, we place the substrate into a stripping chamber and stripe the contact photoresist pattern 54 and polymer layer 71.

The stripping process preferably comprises: a microwave bias power between 100 and 1000 W, a process pressure between 5 and 5000 mTorr., a $O_2/N_2$ ratio between 10:1 and 20:1.

A reaction thought to occur is: CxHyOz (PR)+O*=>$CO_2$, $H_2O$, CO, $H_2$, $O_2$, . . . (lots of volatile materials are generated).

E. Plasma Treatment to Deposit a "By-Products" Layer

Figure 4:
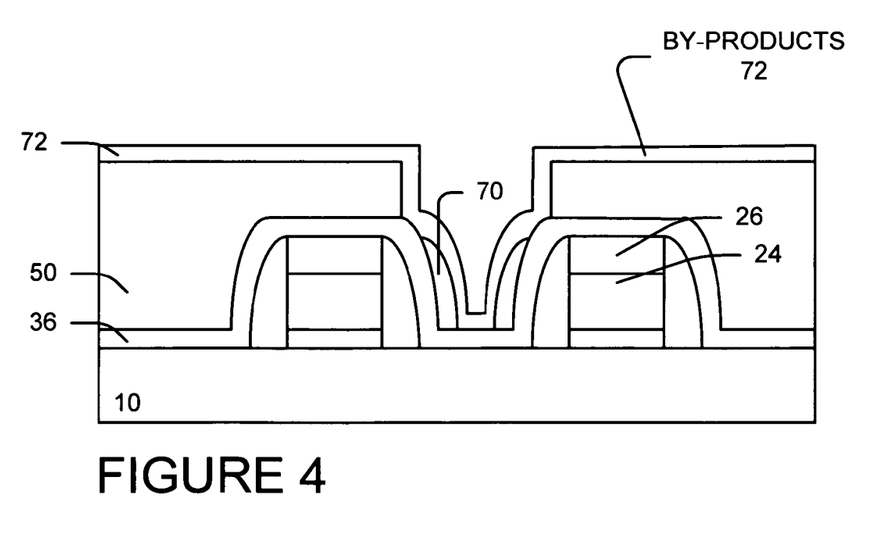

As shown in FIG. 4, we place the substrate into a plasma treatment tool and perform plasma treatment preferably using a fluorine (F), nitrogen (N) and hydrogen (H) (elements) containing gasses. The plasma treatment reacts with the residual spacer 70 and forms a by-products layer 72 on sidewalls of the contact opening (the nitride liner 36, the dielectric layer 50, residue spacer 70). The plasma treatment gases are preferably $NF_3$ (nitrogen trifluoride) and nitrogen ($N_2$) & hydrogen ($H_2$).

The by-products layer 72 is preferably comprised of NxHyFz. The plasma treatment preferably comprises flowing $NF_3$ between 5 and 1000 sccm, flowing N2 between 5 and 5000 sccm, flowing $H_2$ between 5 and 2000 sccm, at a microwave power between 50 and 5000 W; the nitrogen and hydrogen feeds are a "Microwave (MW) down stream" plasma feed.

The plasma treatment more preferably comprises flowing $NF_3$ between 10 and 500 sccm, flowing $N_2$ between 500 and 5000 sccm, flowing $H_2$ between 10 and 500 sccm, at a microwave power between 50 and 5000 W; the nitrogen and hydrogen feeds are preferably a "Microwave (MW) down stream" plasma feed.

Figure 8:
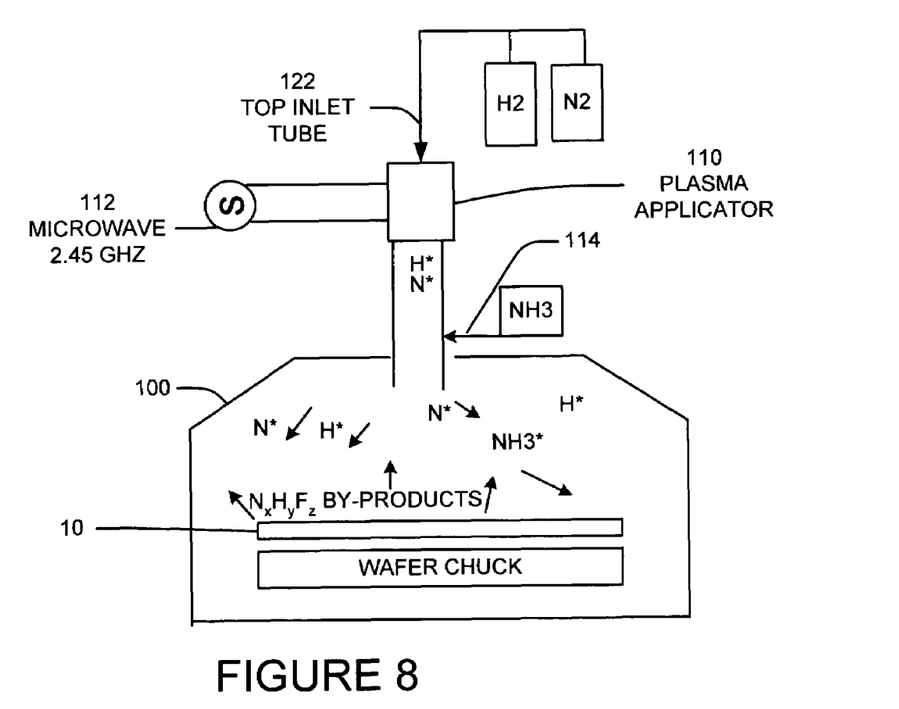
FIG. 8 is a schematic view of a preferred plasma treatment tool according to an embodiment of the invention.

In an aspect, the plasma treatment preferably comprises flowing gas with a molar composition of $NF_3$% between 1 and 75%, $N_2$ between 1 and 99% sccm, flowing $H_2$ between 1 and 75%, at a microwave power between 50 and 5000 W; the nitrogen and hydrogen feeds are a "Microwave (MW) down stream" plasma feed. As shown in FIG. 8, preferably the nitrogen and hydrogen feeds pass thru the plasma applicator 110 before entering the chamber. Preferably, the $NH_3$ flow inlet is after the plasma applicator 110 and before the chamber. The $NF_3$ feed preferably does not pass thru the plasma applicator.

The plasma treatment tool preferably selected from the group consisting of a Microwave tool, ICP tool, a MERIE tool, and a RIE tool.

Preferred Process and Tool for Formation of By-Products Layer 72 Using Plasma Treatment of N2+H2+NF3 Gas Mixture The wafer is transferred from the photoresist stripper tool to a preferred plasma treatment tool with a downstream plasma chamber. See FIG. 8. The plasma source is upstream of the chamber and not in the chamber.

Referring to FIG. 8, we introduce $N_2$+$H_2$ gas to vacuum chamber through top gas inlet port. The $N_2$+$H_2$ flows thru the top inlet tube 122 to the plasma applicator device 110 that is connect to a microwave 112. The microwave excites the $N_2$ and $H_2$. The $N_2$ and $H_2$ plasma flows thru the inlet tube 120 into the chamber 100.

We introduce $NF_3$ gas through Bottom gas inlet port 114 below the plasma device 110 as shown in FIG. 8. The $NF_3$ gas flows thru the inlet tube into the chamber.

In an aspect, the plasma treatment preferably comprises flowing gas with a molar composition of $NF_3$% between 1 and 30%, $N_2$ between 70 and 95% sccm, flowing $H_2$ between 1 and 30%, at a microwave power between 50 and 5000 W. The $NH_3$ feed preferably does not pass thru the plasma applicator. As shown in FIG. 8, preferably the nitrogen and hydrogen feeds pass thru the plasma applicator 110 before entering the chamber. Preferably, the $NF_3$ flow inlet is after the plasma applicator 110 and before the chamber.

After stabilize process conditions, we ignite plasma in the plasma applicator 110 and generate a $N_2$ and $H_2$ plasma. The $N_2$ and $H_2$ plasma can react with the $NF_3$ to produce the F-contained activated radicals. The $NF_3$ gas can be activated to lead to radicals (such as $NF_2+$, $F-$) as FIG. 8. The radicals can react with $H_2$ to from by-products composed of for example $N_xH_yF_z$.

As shown in FIG. 8 and FIG. 4, we deposit a by-products layer 72 on the wafer which can be comprised of $N_xH_yF_z$ with x between 1 and 10; Y between 1 and 7; and z between 1 and 7.

F. Remove Byproducts Layer Preferably Using One of the Following (1) Heat (2) DI Rinse or (3) IR or UV Radiation

Figure 5:
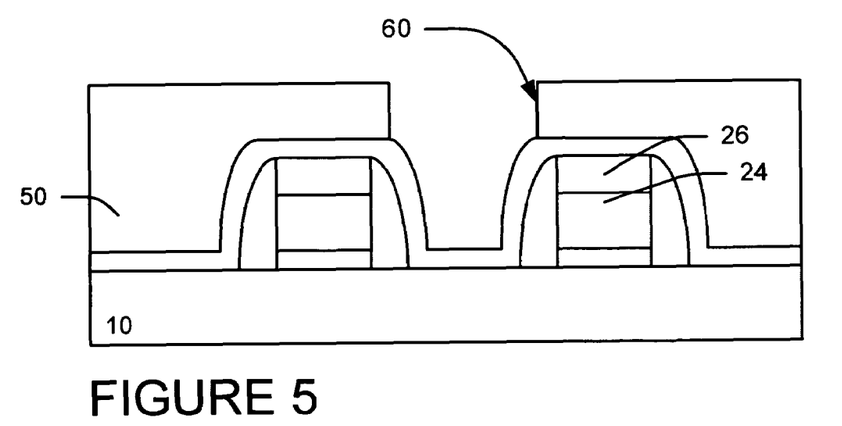

Referring to FIG. 5, we remove the byproducts layer and the residual oxide spacer 70 using one of the following (1) heat (2) DI rinse or (3) IR or UV radiation.

1. Heat

Figure 9:
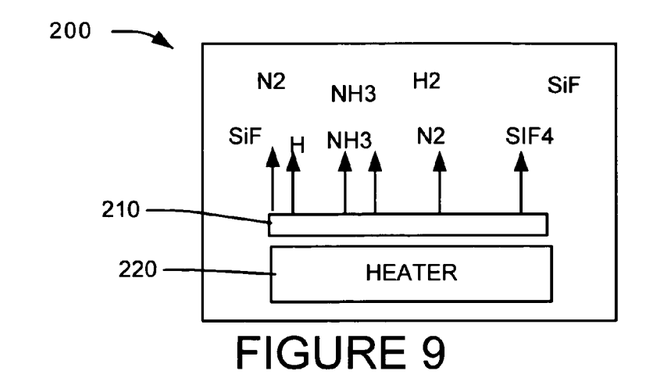
FIG. 9 is a schematic view of a preferred heating tool according to an embodiment of the invention.

FIG. 9 shows an example of a heating chamber 200 used to remove the residual oxide spacer and the by-products layer. FIG. 9 shows a heater 220 heating a wafer 210 and the gases from the process.

The wafer is preferably heated to a temperature greater than 50° C. in preferably a $N_2$ gas (but can be air), a preferably atmospheric pressure.

The residual oxide spacer and $N_xH_yF_z$ by-products preferably are removed by the following reaction:

$$SiO_2 + N_xH_yF_z \xrightarrow{\text{heat and/or DI}} SiH_4 + NH_3 + N_2 + H_2O(g) + O_2 + \ldots \text{others} \quad (A)$$

The residual oxide spacer and $N_xH_yF_z$ by-products are removed are removed.

2. DI Rinse

The $N_xH_yF_z$ by-products layer is soluble in water. The F reacts to become HF. The HF in the water can etch and remove the remaining residual oxide spacer.

3. UV Radiation

The $N_xH_yF_z$ by-products layer can also be removed by UV radiation. The reaction to remove the $N_xH_yF_z$ by-products layer is so similar to the above shown for heating.

G. Nitride Etch

Figure 6:
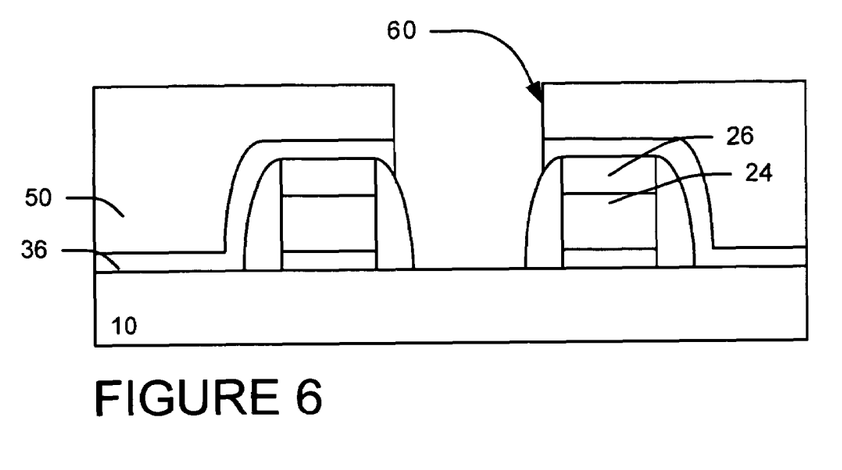

As shown in FIG. 6, now that the by-products layer and residual spacer are removed, then we etch the nitride liner preferably using a nitride etch (selective to oxide) to expose the surface of the substrate in the contact opening 60.

Figure 7:
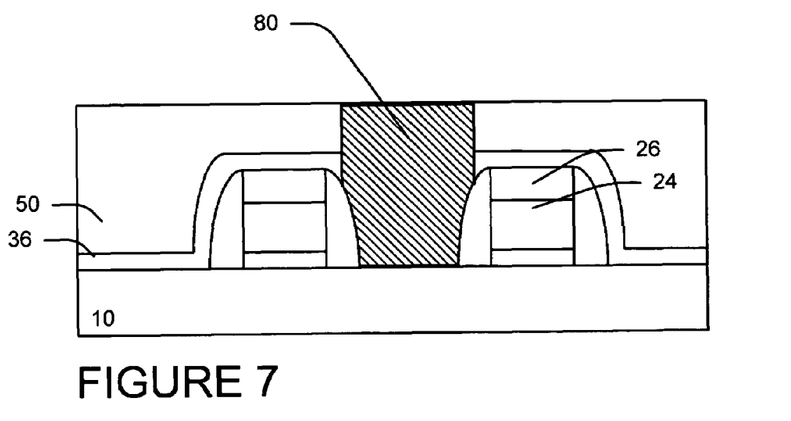

The nitride etch preferably comprises using $CH_2F_2$ (or $CH_3F$, $CF_4$, $NF_3$, $SF_6$, . . . ) at a flow between 1 and 500 sccm, O2 (or N2) flow between 0 and 500 sccm, Ar (or He) flow between 0 and 1000 sccm, a RF power between 10 and 1000 W. The etch can be performed in a MERIE (or DRM, ICP, TCP, DPS, Microwave,) plasma tool H. Contacts As shown in FIG. 7, we form contacts 80 to the substrate in the contact openings 60.

After this we form a first insulation layer over the contacts and the substrate and oxide dielectric layer 50.

I. A Problem Addressed by Some Embodiments

Figure 10:
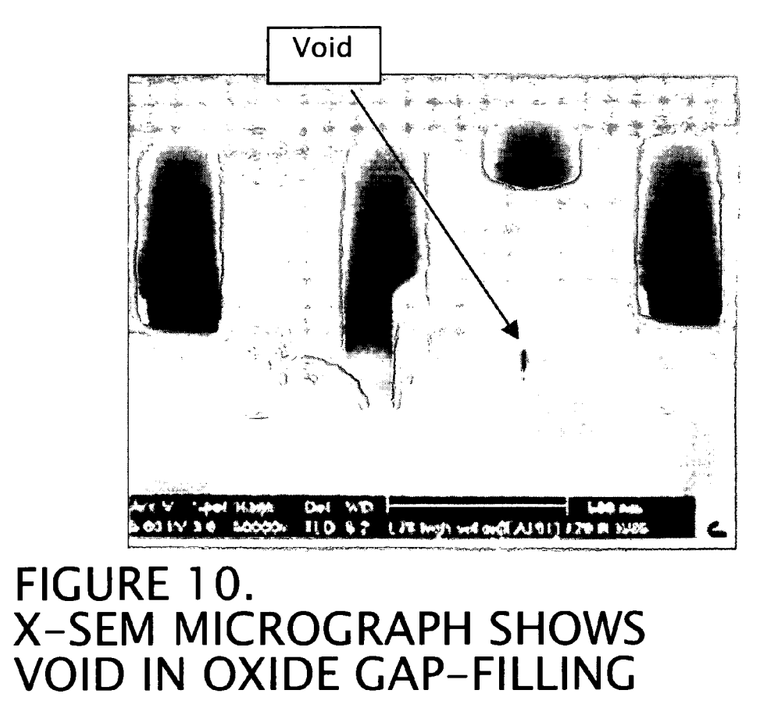
FIG. 10 is a x-SEM micrograph showing a void in oxide gap filling.
Figure 11:
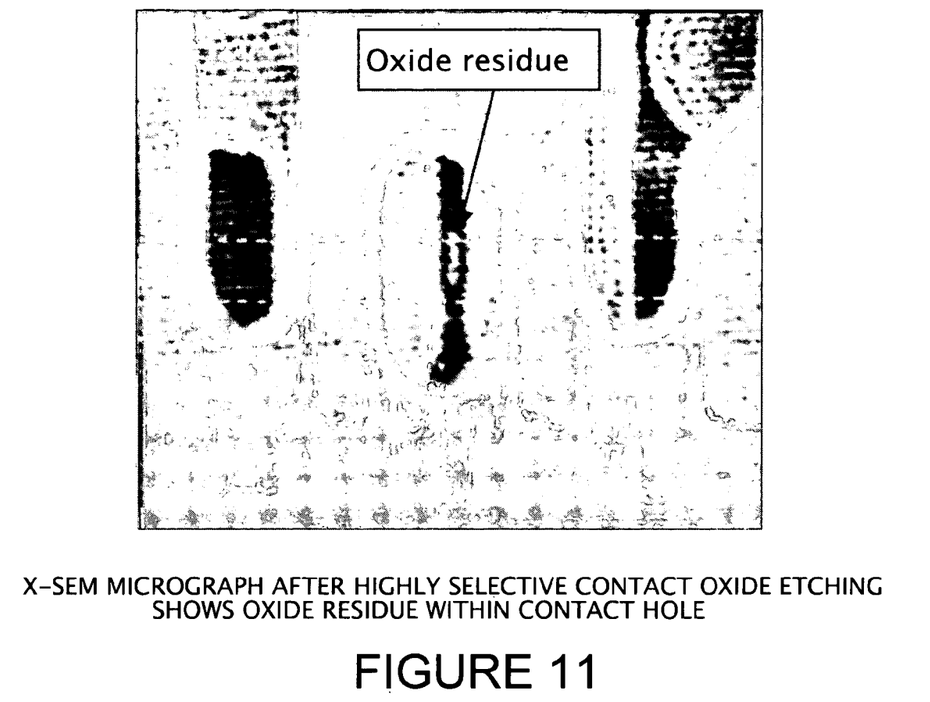
FIG. 11 is a x-SEM micrograph after a highly selective contact oxide etching that shows the reside oxide spacer within the contact hole.
Figure 12:
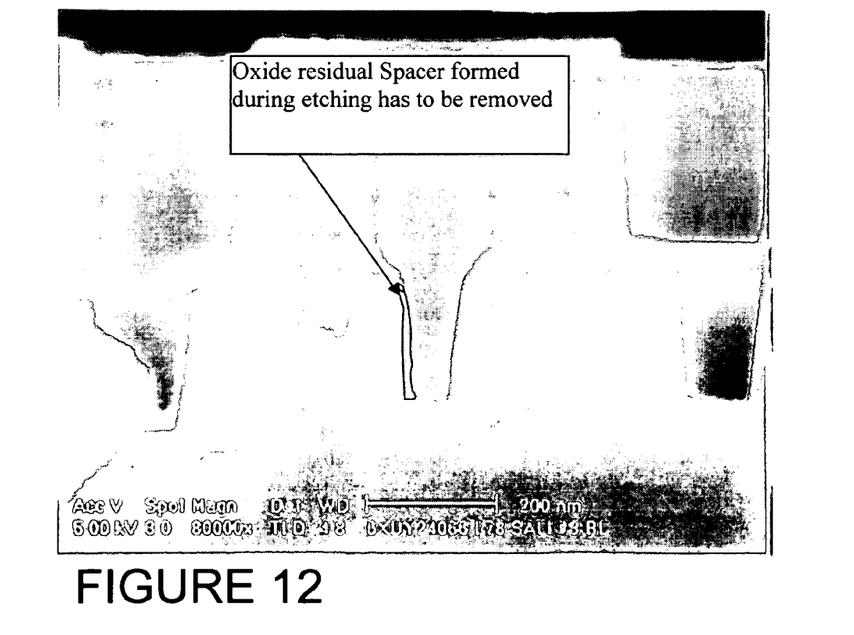
FIG. 12 is a SEM micrograph showing the oxide residual spacer formed during the contact opening etch.

Referring now to the drawing and more particularly to FIGS. 10, 11 and 12, there is shown a structure over which some embodiments are an improvement. It is to be understood in this regard that no portion of FIGS. 10, 11 and 12 are admitted to be prior art as the present invention. Rather, this highly simplified diagram is an effort to provide an improved understanding of the problems that are overcome by some of the embodiments. The recognition of the problem was important.

A process sequence known to the inventors to form Self-Aligned Contact (SAC) is as follows:

1) Highly selective contact oxide etching to form contact Metal 1 to Si-active without short between gate and W-plug of Metal 1 can be obtained by using high polymer gas like $C_2F_4$, $C_3F_8$, $C_4F_8$, $C_5F_8$, and $C_4F_6$.
2) PR strip is to remove photo mask.
3) Wet cleaning like SPM or APM is to remove polymer that is generated during highly selective oxide etching.
4) Nitride etching is to remove nitride that is used as etch barrier layer for highly selective contact oxide etching.

But highly selective contact oxide etching to Si3N4 (or SiON) like self-aligned contact (SAC) formation uses high polymer gas and makes two issues as follows.

1) In the case of some void in gap-filling oxide like FIG. 10, some polymer fills this void and polymer within void prevents oxide etching so that oxide residue is formed within contact hole like SEM FIG. 11. This oxide residue makes contact area decrease to lead to high contact resistance as well particle source. FIG. 10 is a X-SEM micrograph shows void in oxide gap-filling. FIG. 11. is a X-SEM micrograph after highly selective contact oxide etching shows oxide residue within contact hole.
2) Thin oxide spacer beside Si3N4 as SEM FIG. 12 is formed by polymer blocking against oxide etching that decreases contact area and leads to high contact resistance. To remove this two kinds of oxide residue and oxide spacer, if wet cleaning like diluted HF and BOE is used, as contact hole sidewall etch rate is faster than oxide residue, void as well as contact hole size is enlarged. This makes metal gap-filling bad and cause higher electrical short between contact hole through enlarged void. Therefore, unique method to remove little amount of oxide, diluted wet etching like HF and BOE, cannot be used to remove oxide residue and thin oxide spacer.

FIG. 12. is a X-SEM micrograph after highly selectively etching to nitride shows an oxide spacer beside a nitride spacer.

K. Some Benefits of the Some Embodiments

These benefits apply to some embodiments and do not limit the interpretation of the claims.

Embodiments can also remove oxide residue within contact hole due to void. But this process cannot enlarge void because this process is self limited after some amount of etching oxide and self-closed by by-product.

Embodiments can make contact area enlarged to lead to decrease contact resistance to get better quality of device characteristics. Embodiments can also make better yield of device to remove oxide residue within contact hole that can cause particles within contact hole during pre-cleaning of Ar sputter before deposition of metal layer.

Given the variety of embodiments of the present invention just described, the above description and illustrations should not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of forming a contact opening; comprising the steps of:
   a) providing a gate structure over a substrate; the gate structure having gate structure sidewalls;
   b) forming a nitride liner over said gate structure and said substrate; the nitride liner having sidewalls;
   c) providing a dielectric layer over the nitride liner;
   d) forming a contact photoresist pattern over the dielectric layer;
   e) performing a contact opening etch by etching the dielectric layer to form a contact opening and a residual spacer;
   said contact opening exposes portions of said nitride liner over said gate structure sidewalls and over said substrate adjacent to said gate structure;
   said residual spacer is over the sidewalls of said nitride liner;
   f) striping said contact photoresist pattern;
   g) performing a plasma treatment comprising gases containing fluorine, nitrogen and hydrogen to deposit a by-products layer over said residual spacer and said dielectric layer; and
   h) removing said by-products layer and said residual spacer.

2. The method of claim 1 which further comprises:
   removing said by-products layer and said residual spacer using a process of: (1) heating; (2) DI rinsing; or (3) IR or UV radiating.

3. The method of claim 1 which further comprises: said residual spacer is comprised of oxide;
   step (e) further comprises forming a polymer layer over said residual spacer and said nitride liner; and
   step (f) further comprises striping said contact photoresist pattern and said polymer layer.

4. The method of claim 1 which further comprises: etching said nitride liner using a nitride etch to expose the surface of said substrate in said contact opening; forming a contact to said substrate in said contact opening;
   forming a first insulation layer over said contact and said substrate and said dielectric layer.

5. The method of claim 1 wherein said gate structure is comprised of a gate dielectric, a gate electrode and a nitride hard mask.

6. The method of claim 1 wherein said dielectric layer is comprised of oxide and said residual spacer is comprised of oxide.

7. The method of claim 1 wherein the contact opening etch comprises: a RF bias power between 500 and 1000 W, a process pressure between 5 and 200 mTorr, a carbon fluoride containing gas with a flow between 3 and 50 sccm, a $O_2$ flow between 0 and 50 sccm, a $CH_2F_2$ or $CH_3F$ flow between 0 and 50 sccm, a inert gas flow between 0 and 1000 sccm.

8. The method of claim 1 wherein the stripping of said contact photoresist pattern comprises: a microwave bias power between 100 and 1000 W, a process pressure between 5 and 5000 mTorr, an O2/N2 ratio between 10:1 and 20:1.

9. The method of claim 1 wherein the plasma treatment in a down stream plasma tool comprises flowing $N_2$ and $H_2$ and using microwave or RF energy to create a nitrogen and hydrogen plasma upstream of a treatment chamber where the substrate is held; adding $NF_3$ to the nitrogen and hydrogen plasma and flowing the gases into the treatment chamber to plasma treat the substrate.

10. The method of claim 1 wherein the plasma treatment comprises:
    flowing $NF_3$ between 5 and 1000 sccm, flowing $N_2$ between 5 and 5000 sccm, flowing $H_2$ between 5 and 2000 sccm, at a microwave power between 50 and 5000 W; the nitrogen and hydrogen feeds flow through a plasma applicator before entering a chamber.

11. The method of claim 1 wherein the plasma treatment comprises: flowing gas with a molar composition of $NF_3$ between 1 and 75%, $N_2$ between 1 and 99% and $H_2$ between 1 and 75%; the nitrogen and hydrogen feeds flow through a plasma applicator before entering a chamber.

12. The method of claim 1 wherein the plasma treatment comprises: flowing gas with a molar composition of $NF_3$ between 1 and 30%, $N_2$ between 70 and 95% and $H_2$ between 1 and 30%; the nitrogen and hydrogen feeds flow through a plasma applicator before entering a chamber.

13. The method of claim 1 wherein the removal of said by-products layer and said residual spacer comprises heating the substrate to a temperature greater than 50° C. in a $N_2$ gas or air ambient.

14. The method of claim 1 wherein the by-products layer is comprised of NxHyFz with x between 1 and 10; y between 1 and 7; and z between 1 and 7.

15. A method of forming a contact opening comprising the steps of:
    a) providing a gate structure over a substrate;
    b) providing spacers over the sidewalls of the gate structure;
    c) forming a nitride liner over said spacers and said gate structure and said substrate;
    d) providing a dielectric layer over the nitride liner; said dielectric layer is comprised of oxide;
    e) forming a contact photoresist pattern over the dielectric layer;
    f) etching the dielectric layer using fluorocarbons to form a contact opening, a residual spacer and a polymer layer;
    said contact opening exposes portions of said nitride liner over the sidewalls of said gate structure and over said substrate adjacent to said gate structure;
    said residual spacer is over sidewalls of said nitride liner; said polymer layer is over said residual spacer and said nitride liner;
    said residual spacer is comprise of oxide;
       (1) the etching to form said contact opening comprises: carbon fluoride, $O_2$, and $CH_2F_2$ etchants;
    g) striping said contact photoresist pattern and said polymer layer;
    h) performing a $NF_3$ and nitrogen and hydrogen plasma treatment to deposit a by-products layer over said residual spacer and said dielectric layer; and
    i) removing said by-products layer and said residual spacer using one of the following processes: (1) heat; (2) DI rinse; or (3) IR or UV radiation.

16. The method of claim 15 which further includes:
    etching said nitride liner using a nitride etch to expose the surface of said substrate in said contact opening;
    forming a contact to said substrate in said contact opening;
    forming a first insulation layer over said contact and said substrate and dielectric layer.

17. The method of claim 15 wherein said residual spacer is comprised of over 90% oxide.

18. The method of claim 15 wherein the etching to form said contact opening comprises: a RF bias power between 500 and 1000 W, a process pressure between 5 and 200 mTorr, a carbon fluoride containing gas with a flow between 3 and 50 sccm, an $O_2$ flow between 0 and 50 sccm, a $CH_2F_2$ or $CH_3F$ flow between 0 and 50 sccm and an inert gas flow between 0 and 1000 sccm.

19. The method of claim 15 wherein step h) further comprises placing said substrate in a plasma treatment tool; said plasma treatment tool selected from the group consisting of a Microwave tool, ICP tool, a MERIE tool, and a RIE tool.

20. The method of claim 15 wherein the plasma treatment comprises: flowing $NF_3$ between 5 and 1000 sccm, flowing $N_2$ between 5 and 5000 sccm, flowing $H_2$ between 5 and 2000 sccm, at a microwave power between 50 and 5000 W; the nitrogen and hydrogen feeds flow through a plasma applicator before entering a chamber; the $NF_3$ flow does not pass thru a plasma applicator.

21. The method of claim 15 wherein the $NF_3$ and nitrogen and hydrogen plasma treatment comprises: flowing gas with a composition of $NF_3$ between 1 and 75%, $N_2$ between 1 and 99% and $H_2$ between 1 and 75%; the nitrogen and hydrogen feeds flow through a plasma applicator before entering a chamber; and the $NF_3$ flow does not pass thru a plasma applicator.

22. The method of claim 15 wherein the plasma treatment comprises: flowing gas with a molar composition of $NF_3$ between 1 and 30%, nitrogen between 70 and 95% and $H_2$ between 1 and 30%; the nitrogen and hydrogen feeds flow through a plasma applicator before entering a chamber; and the $NF_3$ flow does not pass thru a plasma applicator.

23. The method of claim 15 wherein the by-products layer is comprised of NxHyFz with x between 1 and 10; y between 1 and 7; and z between 1 and 7.

24. A method of forming a contact opening; comprising the steps of:
   a) providing a gate structure over a substrate; the gate structure having gate structure sidewalls;
   b) forming a nitride liner over said gate structure and said substrate; the nitride liner having sidewalls;
   c) providing a dielectric layer over the nitride liner;
   d) forming a contact photoresist pattern over the dielectric layer;
   e) performing a contact opening etch by etching the dielectric layer to form a contact opening;
   said contact opening exposes portions of said nitride liner over said gate structure sidewalls and over said substrate adjacent to said gate structure;
   f) striping said contact photoresist pattern;
   g) performing a plasma treatment comprising gases containing fluorine, nitrogen and hydrogen to deposit a by-products layer over said dielectric layer; and
   h) removing said by-products layer.

25. The method of claim 24 which further comprises:
   in step e) performing the contact opening etch by etching the dielectric layer to form the contact opening and a residual spacer; said residual spacer is over the sidewalls of said nitride liner; and
   in step h) removing said by-products layer and said residual spacer using a process of: (1) heating; (2) DI rinsing; or (3) IR or UV radiation.

26. The method of claim 24 which further comprises:
   In step e) performing the contact opening etch by etching the dielectric layer to form the contact opening and a residual spacer; said residual spacer is over the sidewalls of said nitride liner; and
   the contact opening etch comprises flowing a carbon fluoride containing gas; and
   in step h) removing said by-products layer and said residual spacer using a process of: (1) heating; (2) Dl rinsing; or (3) IR or UV radiation.

* * * * *